United States Patent
Chen et al.

(10) Patent No.: US 10,281,630 B2
(45) Date of Patent: May 7, 2019

(54) OPTICAL FILMS FOR ELECTRONIC DEVICE DISPLAYS

(71) Applicant: Apple Inc., Cupertino, CA (US)

(72) Inventors: Yuan Chen, Santa Clara, CA (US);
Hossein Nemati, Santa Clara, CA (US);
Chia Hsuan Tai, Sunnyvale, CA (US);
Jin Yan, Santa Clara, CA (US); Young Cheol Yang, Sunnyvale, CA (US);
Zhibing Ge, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 40 days.

(21) Appl. No.: 15/351,212

(22) Filed: Nov. 14, 2016

(65) Prior Publication Data

US 2018/0081223 A1 Mar. 22, 2018

Related U.S. Application Data

(60) Provisional application No. 62/396,713, filed on Sep. 19, 2016.

(51) Int. Cl.
*G02B 5/30* (2006.01)
*H01L 27/32* (2006.01)
(Continued)

(52) U.S. Cl.
CPC ......... *G02B 5/3016* (2013.01); *G02B 5/3041* (2013.01); *G02B 5/3083* (2013.01);
(Continued)

(58) Field of Classification Search
CPC ............. G02F 1/13363; G02F 1/13338; G02F 1/133514; G02F 1/133528; G02F 1/1347;
(Continued)

(56) References Cited

U.S. PATENT DOCUMENTS 7,232,594 B2  6/2007  Miroshin et al.
8,115,892 B2  2/2012  Zhong et al.
(Continued)

FOREIGN PATENT DOCUMENTS

EP  829744  3/2005

*Primary Examiner* — Nathanael R Briggs
(74) *Attorney, Agent, or Firm* — Treyz Law Group, P.C.; Jospeh F. Guihan

(57) ABSTRACT

A display may include an optical film to promote sunglass-friendly viewing of the display. Displays may include linear polarizers. For example, a liquid crystal display may have a linear polarizer above a liquid crystal layer, whereas an organic light-emitting diode display may have a linear polarizer that forms a portion of a circular polarizer to reduce reflections in the display. Displays that emit linearly polarized light may not be compatible with polarized sunglasses. To ensure an optimal user experience for users wearing sunglasses, displays may include sunglass-friendly optical films. A sunglass-friendly optical film may be a film formed from a birefringent material such as a polymer or liquid crystal. The sunglass-friendly optical film may have an optical axis that is at a 45° angle relative to the optical axis of the underlying linear polarizer. The sunglass-friendly optical film may be patterned to have reduced thickness regions.

19 Claims, 15 Drawing Sheets

(51) Int. Cl.
*H01L 51/00* (2006.01)
*H01L 51/52* (2006.01)
*G02F 1/1333* (2006.01)
*G02F 1/1335* (2006.01)
*G02F 1/13363* (2006.01)

(52) U.S. Cl.
CPC ...... *G02F 1/133528* (2013.01); *H01L 27/323* (2013.01); *H01L 51/5271* (2013.01); *H01L 51/5281* (2013.01); *G02F 1/13338* (2013.01); *G02F 1/133615* (2013.01); *G02F 2001/133635* (2013.01); *G02F 2001/133638* (2013.01); *H01L 51/0011* (2013.01); *H01L 51/0076* (2013.01); *H01L 2251/558* (2013.01)

(58) Field of Classification Search
CPC ......... G02F 1/136; G02F 2001/133631; G02F 2001/133633; G02F 2001/133638; G02F 2413/09; G02F 1/2001; G02F 1/133631; G02B 5/3016; G02B 5/3041; G02B 5/3803
See application file for complete search history.

(56) References Cited

U.S. PATENT DOCUMENTS

| | | | |
|---|---|---|---|
| 8,462,300 | B2 | 6/2013 | Nanmatsu et al. |
| 8,558,970 | B2 | 10/2013 | Obata et al. |
| 8,848,114 | B2 | 9/2014 | Wang et al. |
| 9,116,390 | B2 * | 8/2015 | Powell ................ G02F 1/13363 |
| 2010/0073604 | A1 * | 3/2010 | Okuyama ........ B29D 11/00644 349/75 |
| 2011/0157698 | A1 * | 6/2011 | Yoshimi ................ G02B 27/26 359/462 |
| 2011/0292330 | A1 * | 12/2011 | Huang ................ G02B 5/3083 349/117 |
| 2013/0100367 | A1 * | 4/2013 | Takahashi ........ B29D 11/00644 349/15 |
| 2014/0355116 | A1 * | 12/2014 | Wu ...................... G02B 5/3083 359/489.07 |
| 2016/0154159 | A1 * | 6/2016 | Kim ..................... G02B 5/3083 359/489.07 |

\* cited by examiner

OPTICAL FILMS FOR ELECTRONIC DEVICE DISPLAYS

This application claims the benefit of provisional patent application No. 62/396,713, filed Sep. 19, 2016, which is hereby incorporated by reference herein in its entirety.

BACKGROUND

This relates generally to displays for electronic devices, and more particularly, to displays with optical films that ensure sunglass-friendly viewing.

Electronic devices often include displays. For example, an electronic device may have an organic light-emitting diode display based on organic-light-emitting diode pixels or a liquid crystal display based on liquid crystal pixels.

Conventional liquid crystal displays and light-emitting diode displays may emit linearly polarized light. This may cause problems for users that view the display while wearing polarized sunglasses. Polarized sunglasses may only pass light of a given orientation. Depending on the orientation of display, the light emitted by the display may therefore not be visible to a user wearing sunglasses.

Optical films are sometimes included in displays to promote sunglass-friendly viewing. However, conventional optical films may undesirably reduce the intensity of light emitted from the display and lead to color differences in the display depending on the orientation of the display.

It would therefore be desirable to be able to provide improved displays for sunglass-friendly viewing.

SUMMARY

A display for an electronic device may include an optical film to promote sunglass-friendly viewing of the display. Displays may include linear polarizers that cause emitted light to be linearly polarized. For example, a liquid crystal display may have a linear polarizer above a liquid crystal layer, whereas an organic light-emitting diode display may have a linear polarizer that forms a portion of a circular polarizer to reduce reflections in the display.

Displays that emit linearly polarized light may not be compatible with polarized sunglasses. Polarized sunglasses may only pass light of a certain orientation. Depending on the orientation of display, the light emitted by the display may therefore not be visible to a user wearing polarized sunglasses. To ensure an optimal user experience for users wearing sunglasses, displays may include sunglass-friendly optical films.

A sunglass-friendly optical film may be a film formed from a birefringent material such as a polymer or liquid crystal. The sunglass-friendly optical film may have an optical axis that is at a 45° angle relative to the optical axis of the underlying linear polarizer. The sunglass-friendly optical film may be patterned to have reduced thickness regions.

The sunglass-friendly optical film may include a liquid crystal layer formed over an underlying base layer. The reduced thickness regions may be quarter wave plate regions and the liquid crystal layer may also have three quarter wave plate regions. Instead of varying the thickness of the sunglass-friendly optical film, the birefringence of the sunglass-friendly optical film may be varied to vary the retardation of the sunglass-friendly optical film. In some embodiments, both the thickness and the birefringence of the sunglass-friendly optical film may vary.

DETAILED DESCRIPTION

Electronic devices such as cellular telephones, tablet computers, laptop computers, desktop computers, computers integrated into computer monitors, televisions, media players, portable devices, and other electronic equipment may include displays. The displays of these electronic devices may include sunglass-friendly optical films that modify the light emitted by the display for sunglass-friendly viewing. The optical films may modify the light such that a user wearing sunglasses will be able to operate the electronic device in any orientation with minimal color change and intensity loss.

Illustrative electronic devices of the types that may be provided with sunglass-friendly displays are shown in FIGS. 1, 2, 3, 4, and 5.

Figure 1:
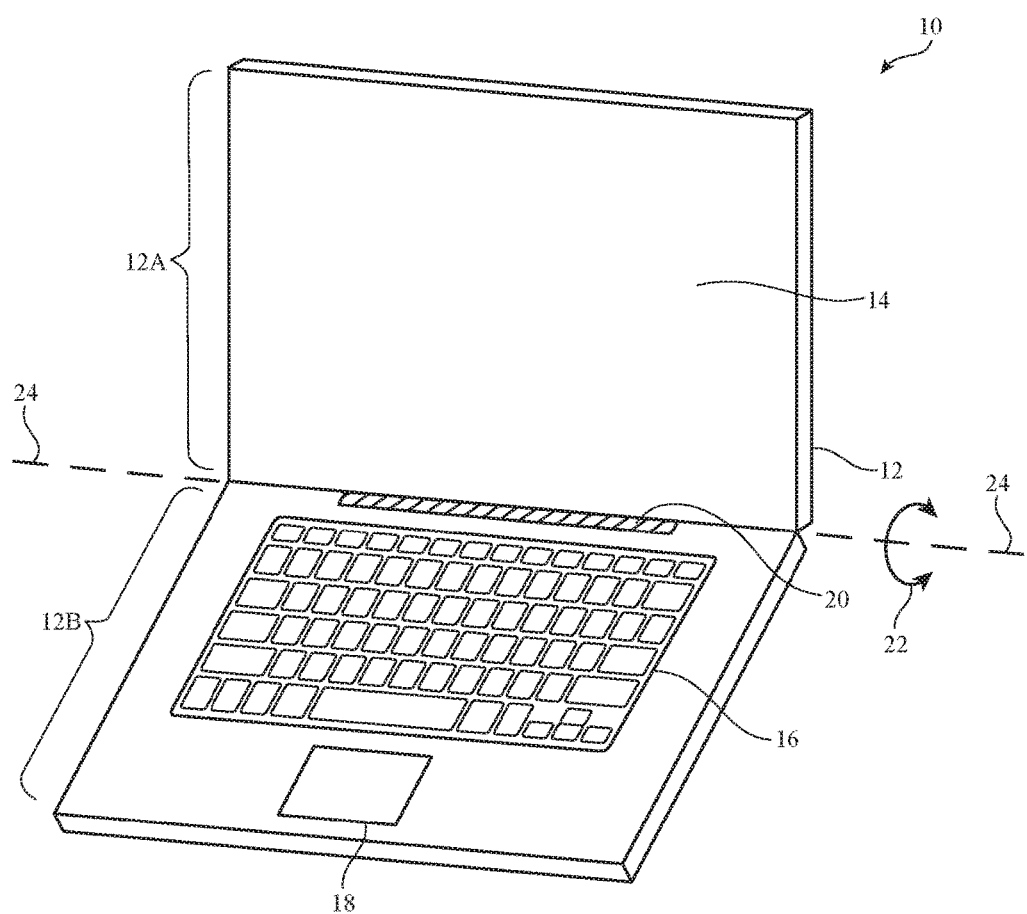
FIG. 1 is a perspective view of an illustrative electronic device such as a laptop computer that has a display with a sunglass-friendly optical film in accordance with an embodiment.

Electronic device 10 of FIG. 1 has the shape of a laptop computer and has upper housing 12A and lower housing 12B with components such as keyboard 16 and touchpad 18. Device 10 has hinge structures 20 (sometimes referred to as a clutch barrel) to allow upper housing 12A to rotate in directions 22 about rotational axis 24 relative to lower housing 12B. Display 14 is mounted in housing 12A. Upper housing 12A, which may sometimes be referred to as a display housing or lid, is placed in a closed position by rotating upper housing 12A towards lower housing 12B about rotational axis 24.

Figure 2:
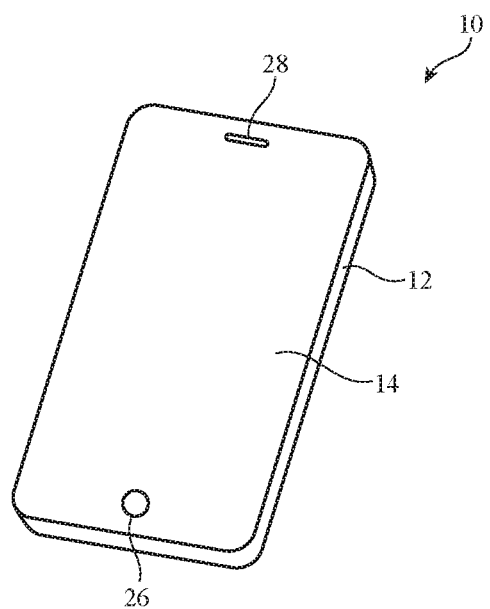
FIG. 2 is a perspective view of an illustrative electronic device such as a handheld electronic device that has a display with a sunglass-friendly optical film in accordance with an embodiment.

FIG. 2 shows an illustrative configuration for electronic device 10 based on a handheld device such as a cellular telephone, music player, gaming device, navigation unit, or other compact device. In this type of configuration for device 10, housing 12 has opposing front and rear surfaces. Display 14 is mounted on a front face of housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Display 14 may be protected using a display cover layer such as a layer of transparent glass or clear plastic. Openings may be formed in the display cover layer. For example, an opening may be formed in the display cover layer to accommodate a button such as button 26. An opening may also be formed in the display cover layer to accommodate ports such as speaker port 28. Openings may be formed in housing 12 to form communications ports, holes for buttons, and other structures.

Figure 3:
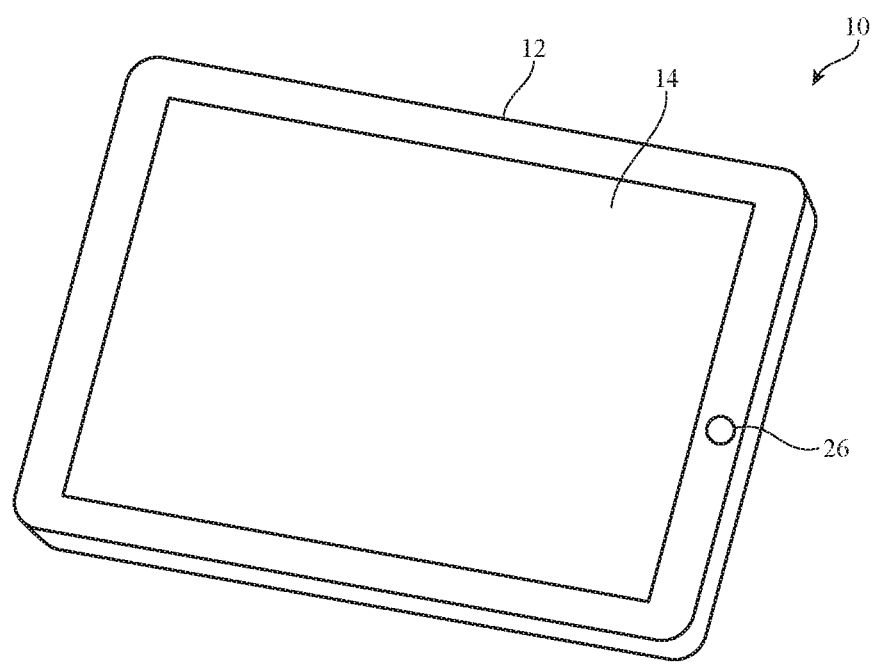
FIG. 3 is a perspective view of an illustrative electronic device such as a tablet computer that has a display with a sunglass-friendly optical film in accordance with an embodiment.

In the example of FIG. 3, electronic device 10 is a tablet computer. In electronic device 10 of FIG. 3, housing 12 has opposing planar front and rear surfaces. Display 14 is mounted on the front surface of housing 12. As shown in FIG. 3, display 14 has an opening to accommodate button 26.

Figure 4:
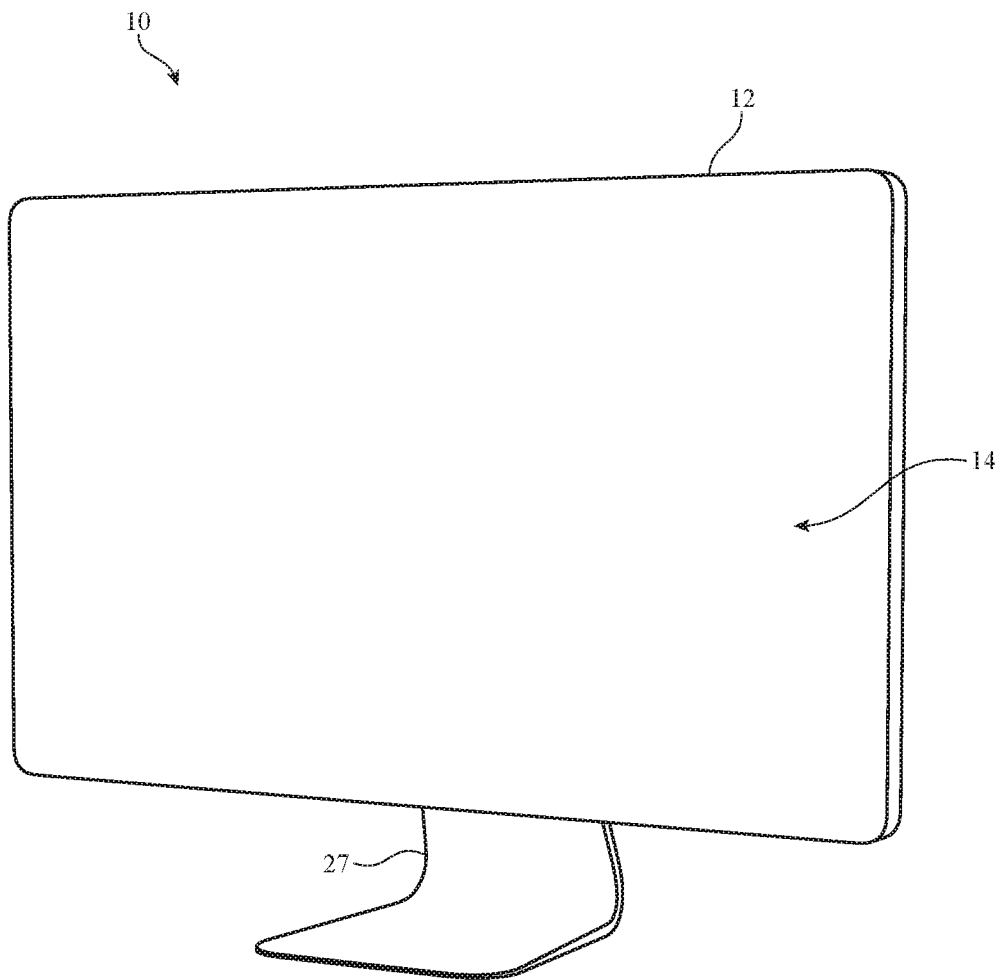
FIG. 4 is a perspective view of an illustrative electronic device such as a computer or television that has a display with a sunglass-friendly optical film in accordance with an embodiment.

FIG. 4 shows an illustrative configuration for electronic device 10 in which device 10 is a computer display, a computer that has an integrated computer display, or a television. Display 14 is mounted on a front face of housing 12. With this type of arrangement, housing 12 for device 10 may be mounted on a wall or may have an optional structure such as support stand 27 to support device 10 on a flat surface such as a table top or desk.

Figure 5:
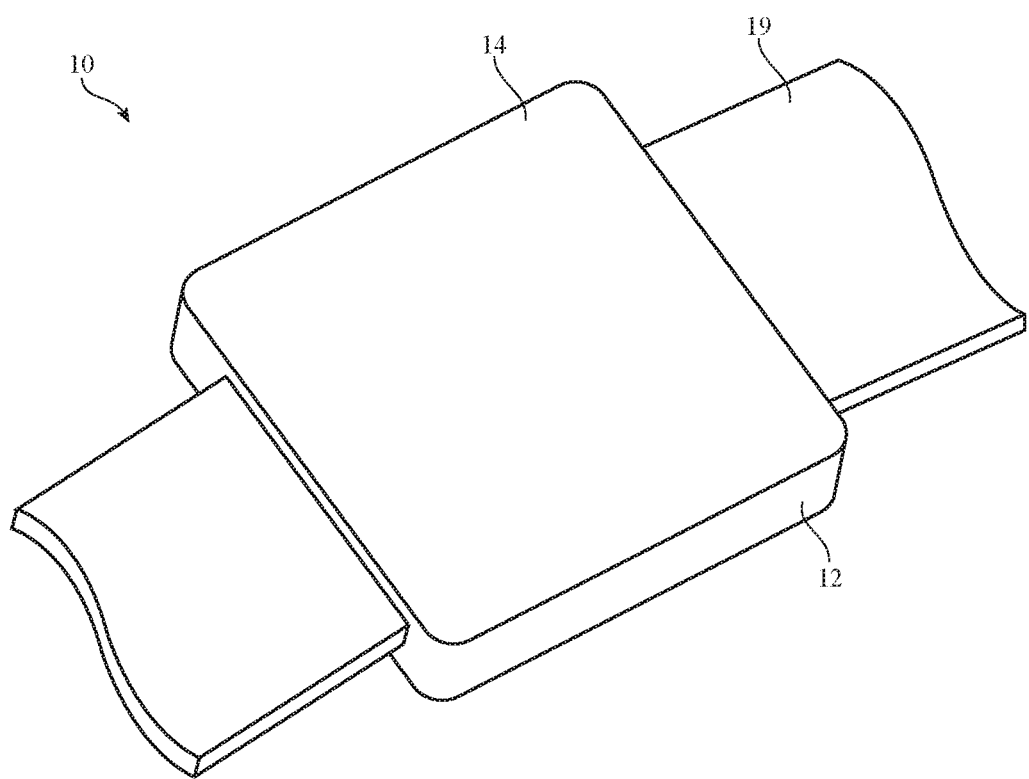
FIG. 5 is a perspective view of an illustrative electronic device that has a display with a sunglass-friendly optical film in accordance with an embodiment.

FIG. 5 shows an illustrative configuration for electronic device 10 in which device 10 is a wrist-watch device. Display 14 is mounted on a front face of housing 12. Electronic device 10 may have straps 19 for securing electronic device 10 to a user's wrist.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may be a liquid crystal display, an organic light-emitting diode display, a plasma display, an electrophoretic display, an electrowetting display, a display using other types of display technology, or a display that includes display structures formed using more than one of these display technologies.

Figure 6:
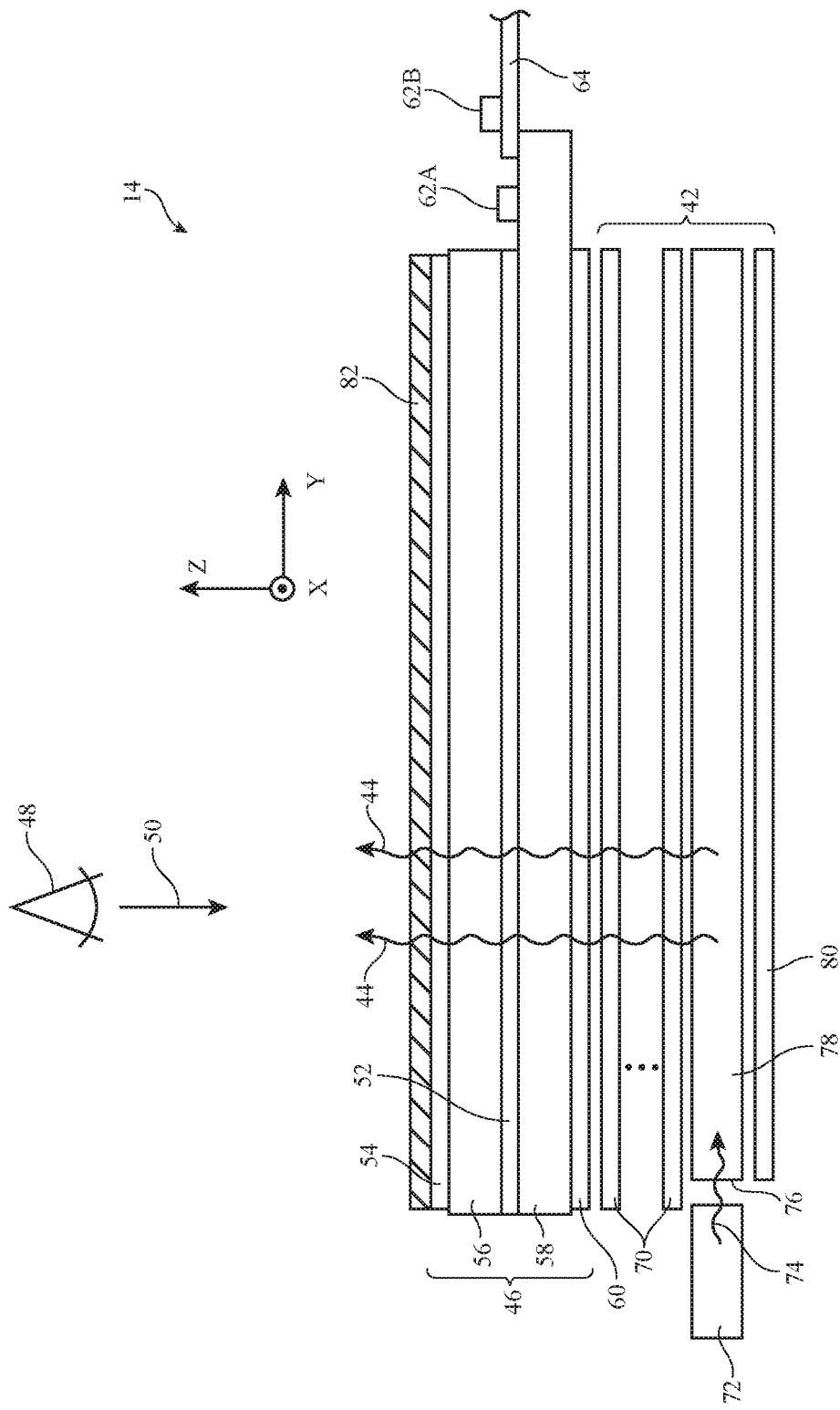
FIG. 6 is a cross-sectional side view of an illustrative liquid crystal display with a sunglass-friendly optical film on the upper polarizer layer in accordance with an embodiment.

A cross-sectional side view of an illustrative configuration for display 14 of device 10 (e.g., for display 14 of the devices of FIG. 1, FIG. 2, FIG. 3, FIG. 4, FIG. 5 or other suitable electronic devices) is shown in FIG. 6. As shown in FIG. 6, display 14 may include backlight structures such as backlight unit 42 for producing backlight 44. During operation, backlight 44 travels outwards (vertically upwards in dimension Z in the orientation of FIG. 6) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example).

Backlight structures 42 may include a light guide plate such as light guide plate 78 (sometimes referred to herein as a light guide layer). Light guide layer 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide layer 78 and may be distributed in dimensions X and Y throughout light guide layer 78 due to the principal of total internal reflection. Light guide layer 78 may include light-scattering features such as pits or bumps. The light-scattering features may be located on an upper surface and/or on an opposing lower surface of light guide plate 78.

Light 74 that scatters upwards in direction Z from light guide layer 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide layer 78 and reflector 80. For example, if light guide plate 78 has a rectangular footprint in the X-Y plane of FIG. 5, optical films 70 and reflector 80 may have a matching rectangular footprint.

Lower polarizer layer 60 and upper polarizer layer 54 may be linear polarizers with optical axes that are offset by 90°. The linear polarizers may (in combination with liquid crystal layer 52) allow per-pixel control of the magnitude of emitted light. After the light passes through upper polarizer 54, the light may be linearly polarized. Linearly polarized light may not be suitable for easy viewing by a user wearing sunglasses. Since polarized sunglasses only pass incoming light of one orientation, the linearly polarized light from upper polarizer 54 will not be viewable by the sunglasses in either the landscape orientation or the portrait orientation of the display. In order to ensure that display 14 may be operated in any orientation by a user wearing sunglasses, sunglass-friendly optical film 82 may be included in display 14.

Sunglass-friendly optical film 82 (sometimes referred to as sunglass-friendly film 82, optical film 82, film 82, or layer 82) may be included directly above upper polarizer 54 (sometimes referred to as linear polarizer 54 or polarizer 54). Optical film 82 may modify the light emitted from display 14 so that the light is perceived as uniform to a user wearing sunglasses regardless of the orientation of the display. Optical film 82 may include more than one film or layer if desired. Optical film 82 may be attached to polarizer 54 with an adhesive layer or optical film 82 may be laminated directly to polarizer 54. In general, optical film 82 may be attached to polarizer 54 using any desired method.

Optical film 82 may be a waveplate (sometimes referred to as a retarder) that has an optical axis that is at an angle of 45° with respect to the optical axis of polarizer 54. The retarder may delay the phase of incoming light such that the emitted light has minimal variance to a user with sunglasses regardless of display orientation.

Figure 7:
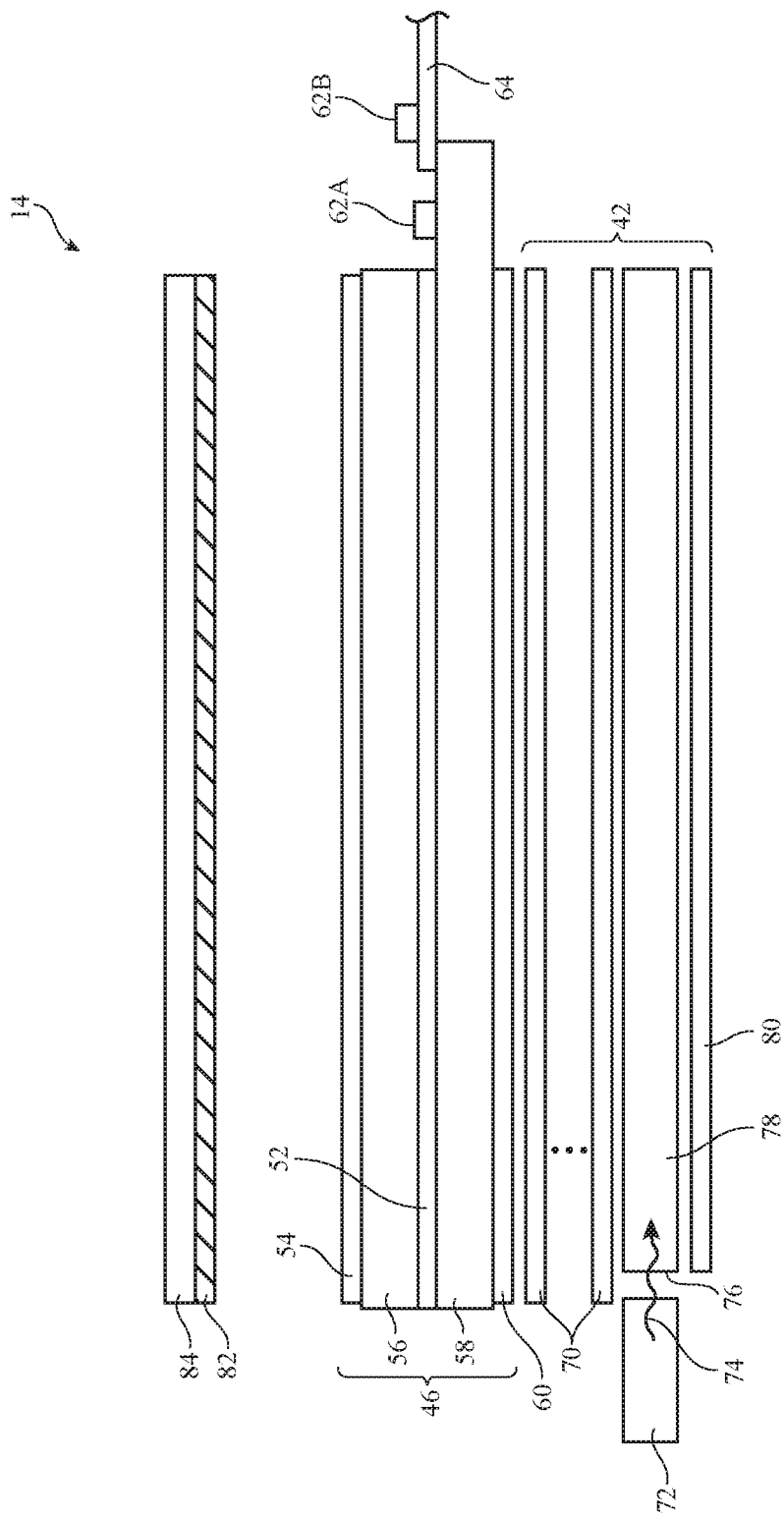
FIG. 7 is a cross-sectional side view of an illustrative liquid crystal display with a sunglass-friendly optical film on the lower surface of an additional electronic device layer in accordance with an embodiment.
Figure 8:
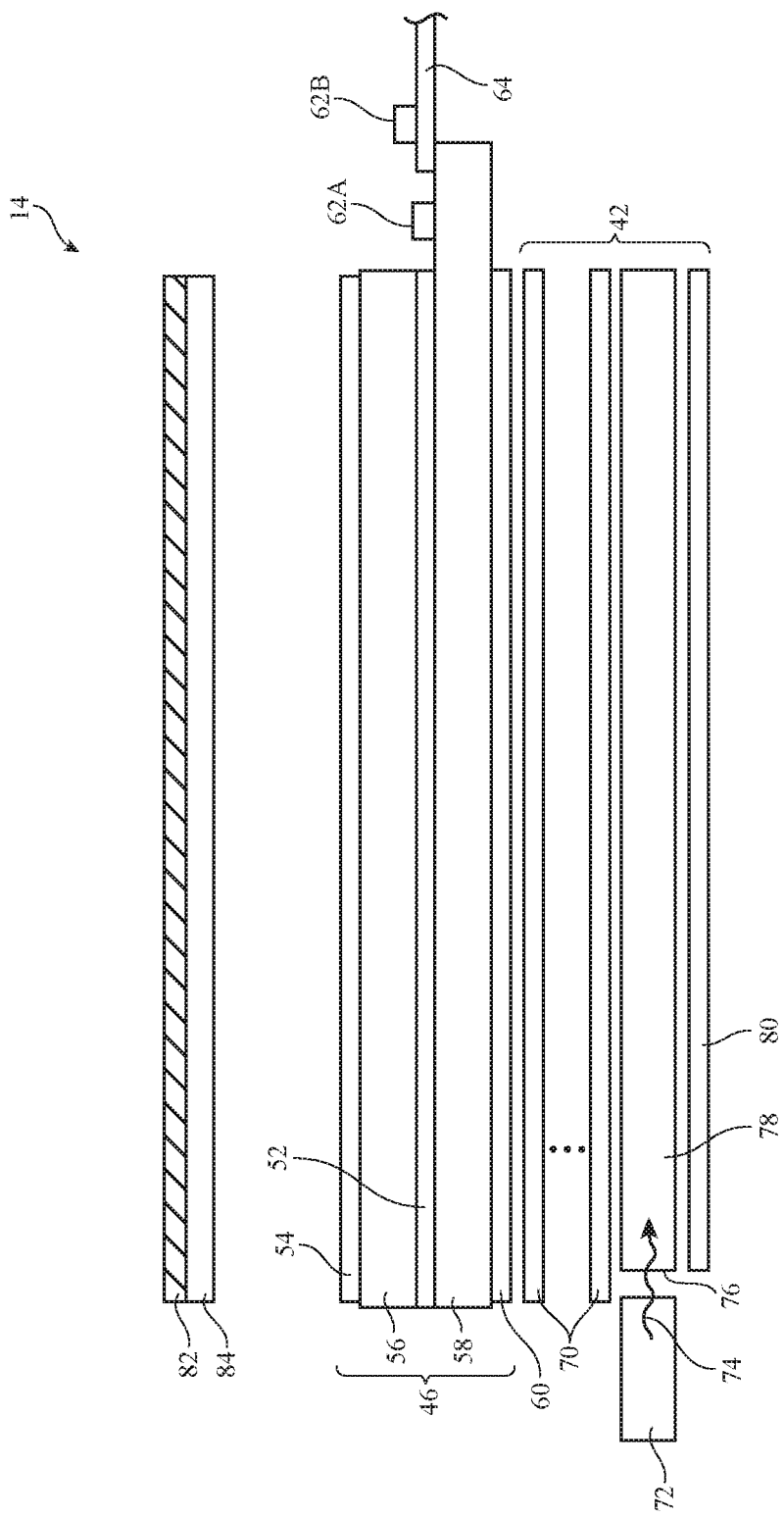
FIG. 8 is a cross-sectional side view of an illustrative liquid crystal display with a sunglass-friendly optical film on the upper surface of an additional electronic device layer in accordance with an embodiment.

FIG. 6 shows optical film 82 positioned directly adjacent to polarizer 54. This example is merely illustrative, and optical film 82 may be positioned in any desired location within electronic device 10. For example, as shown in FIG. 7, display 14 may include an additional layer 84. The additional layer 84 may be, for example, a touch sensor layer, a cover glass, or any other desired layer. Sunglass-friendly film 82 may be positioned on the lower surface of the additional layer, as shown in FIG. 7. Alternatively, as shown in FIG. 8, sunglass-friendly film 82 may be positioned on the upper surface of additional layer 84. In general sunglass-friendly film 82 may be positioned anywhere above upper polarizer 54 that allows the emitted light to pass through optical film 82 after passing through polarizer 54. Additionally, the examples above of a sunglass-friendly film being incorporated into a liquid crystal display are merely illustrative, and a sunglass-friendly film may be incorporated into other types of displays such as organic light-emitting diode displays if desired.

Figure 9:
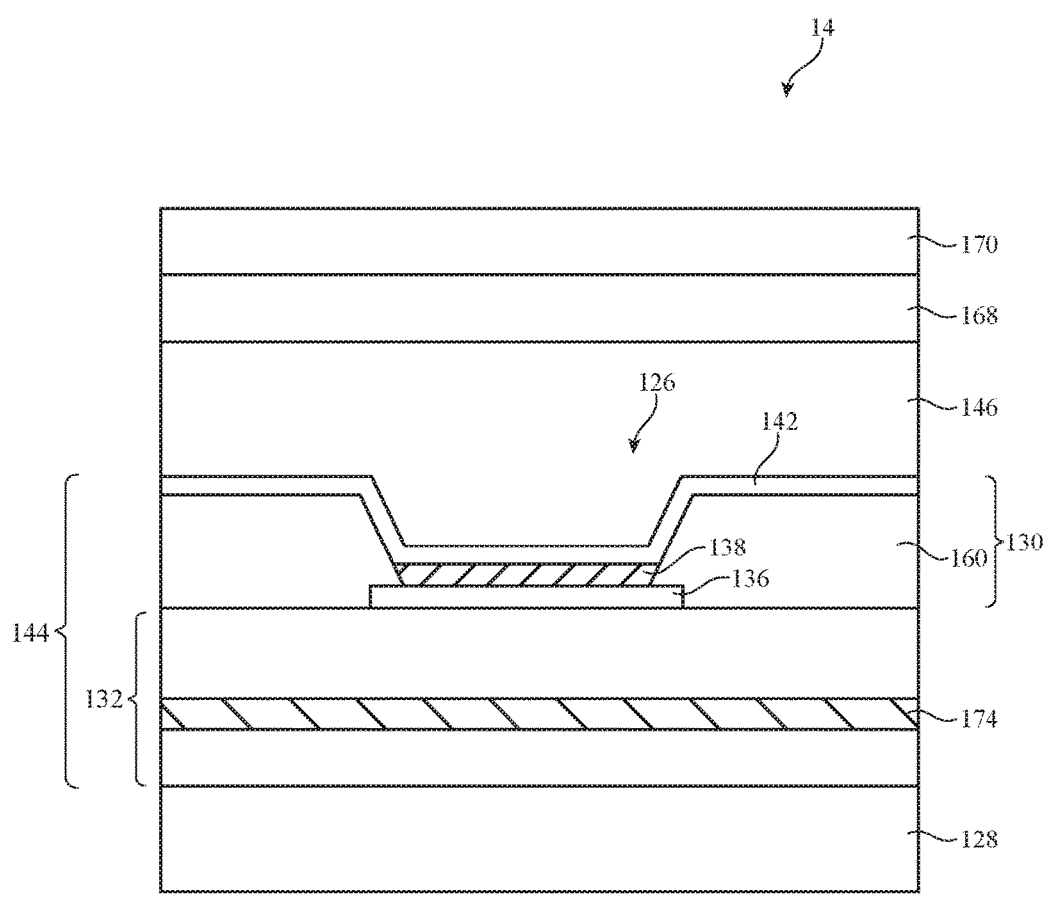
FIG. 9 is a cross-sectional side view of an illustrative organic light-emitting diode display in accordance with an embodiment.

A cross-sectional side view of a portion of an illustrative organic light-emitting diode display is shown in FIG. 9. As shown in FIG. 9, display 14 may include a substrate layer such as substrate layer 128. Substrate 128 may be formed from a polymer or other suitable materials.

Thin-film transistor circuitry 144 (sometimes referred to as display layers 144) may be formed on substrate 128. Thin film transistor circuitry 144 may include layers 132. Layers 132 may include inorganic layers such as inorganic buffer layers, barrier layers (e.g., barrier layers to block moisture and impurities), gate insulator, passivation, interlayer dielectric, and other inorganic dielectric layers. Layers 132 may also include organic dielectric layers such as a polymer planarization layer. Metal layers and semiconductor layers may also be included within layers 132. For example, semiconductors such as silicon, semiconducting-oxide semiconductors, or other semiconductor materials may be used in forming semiconductor channel regions for thin-film transistors. Metal in layers 132 such as metal traces 174 may be used in forming transistor gate terminals, transistor source-drain terminals, capacitor electrodes, and metal interconnects.

As shown in FIG. 9, display layers 144 may include diode anode structures such as anode 136. Anode 136 may be formed from a layer of conductive material such as metal on the surface of layers 132 (e.g., on the surface of a planarization layer that covers underlying thin-film transistor structures). Light-emitting diode 126 may be formed within an opening in pixel definition layer 160. Pixel definition layer 160 may be formed from a patterned photoimageable polymer such as polyimide and/or may be formed from one or more inorganic layers such as silicon nitride, silicon dioxide, or other suitable materials.

In each light-emitting diode, layers of organic material 138 may be interposed between a respective anode 136 and cathode 142. Anodes 136 may be patterned from a layer of metal (e.g., silver) and/or one or more other conductive layers such as a layer of indium tin oxide or other transparent conductive material. Cathode 142 may be formed from a common conductive layer that is deposited on top of pixel definition layer 160. Cathode 142 may be formed from a thin metal layer (e.g., a layer of metal such as a magnesium silver layer) and/or indium tin oxide or other transparent conductive material. Cathode 142 is preferably sufficiently transparent to allow light to exit light emitting diode 126.

If desired, the anode of diode 126 may be formed from a blanket conductive layer and the cathode of diode 126 may be formed from a patterned conductive layer. The illustrative configuration of display 14 in which a transparent blanket cathode layer 142 covers diodes that have individually patterned anodes 136 allows light to be emitted from the top of display 14 (i.e., display 14 in the example of FIG. 9 is a "top emission" organic light-emitting diode display). Display 14 may be implemented using a bottom emission configuration if desired. Layers such as layers 136, 138, and 142 are used in forming organic light-emitting diodes such as diode 126 of FIG. 9, so this portion of display 14 is sometimes referred to as an organic light-emitting diode layer (see, e.g., layer 130 of FIG. 9).

If desired, display 14 may have a protective outer display layer such as cover layer 170. The outer display layer may be formed from a material such as sapphire, glass, plastic, clear ceramic, or other transparent material. Protective layer 146 may cover cathode 142. Layer 146, which may sometimes be referred to as an encapsulation layer may include moisture barrier structures, encapsulant materials such as polymers, adhesive, and/or other materials to help protect thin-film transistor circuitry.

Functional layers 168 may be interposed between layer 146 and cover layer 170. Functional layers 168 may include a touch sensor layer, a circular polarizer layer, a sunglass-friendly optical film, and other layers. A circular polarizer layer may help reduce light reflections from reflective structures such as anodes 136. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover glass layer 170 and functional layers 168 to underlying display layers such as layer 146, thin-film transistor circuitry 144, and substrate 128.

Organic layer 138 may include an organic emissive layer (e.g., a red emissive layer in red diodes that emits red light, a green emissive layer in green diodes that emits green light, and a blue emissive layer in blue diodes that emits blue light, etc.). The emissive material may be a material such as a phosphorescent material or fluorescent material that emits light during diode operation. The emissive material in layer 138 may be sandwiched between additional diode layers such as hole injection layers, hole transport layers, electron injection layers, and electron transport layers.

Figure 10:
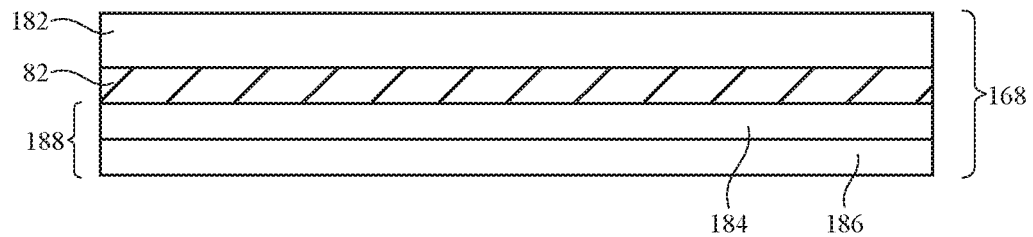
FIG. 10 is a cross-sectional side view of illustrative functional layers including a sunglass-friendly optical film that may be included in an organic light-emitting diode display in accordance with an embodiment.
Figure 11:
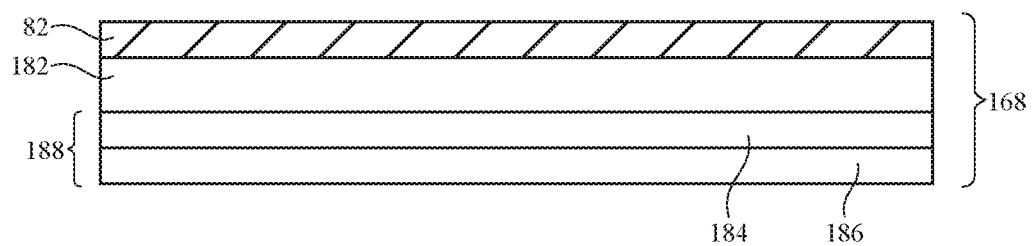
FIG. 11 is a cross-sectional side view of illustrative functional layers for an organic light-emitting diode display including a sunglass-friendly optical film on a touch sensor layer in accordance with an embodiment.

As shown in FIGS. 10 and 11, a sunglass-friendly film may be incorporated into the functional layers of an organic light-emitting diode display such as display 14 in FIG. 9. In FIG. 10, functional layers 168 include touch sensor layer 182, sunglass-friendly film 82, and circular polarizer 188. Touch sensor layer 182 may be formed from an array of capacitive touch sensor electrodes on a flexible polymer substrate. The touch sensor layer may be used to gather touch input from the fingers of a user, from a stylus, or from other external objects. Circular polarizer layer 188 may help reduce light reflections from reflective structures such as anodes 136 in FIG. 9. Circular polarizer 188 may include quarter wave plate (QWP) 186 and linear polarizer 184. As shown in FIG. 10, a sunglass-friendly film 82 may be interposed between polarizer 184 of circular polarizer 188 and touch sensor layer 182.

Optical film 82 may modify the light emitted from display 14 so that the light is perceived as uniform to a user wearing sunglasses regardless of the orientation of the display. Optical film 82 may include more than one film or layer if desired. Optical film 82 may be attached to polarizer 184 with an adhesive layer or optical film 82 may be laminated directly to polarizer 184. In general, optical film 82 may be attached to polarizer 184 using any desired method.

Optical film 82 may be a waveplate (sometimes referred to as a retarder) that has an optical axis that is at an angle of 45° with respect to the optical axis of polarizer 184. The retarder may delay the phase of incoming light such that the emitted light has minimal variance to a user with sunglasses regardless of display orientation.

FIG. 10 shows optical film 82 positioned directly adjacent to polarizer 184. This example is merely illustrative, and optical film 82 may be positioned in any desired location within electronic device 10. As shown in FIG. 11, for example, optical film 82 may be formed on an upper surface of touch sensor layer 182 (instead of on a lower surface of touch sensor layer 182 as shown in FIG. 10). In general, optical film 82 may be positioned at any desired location above polarizer 184 of circular polarizer 188.

Depending on the incoming light received by optical film 82 in FIGS. 6-8, 10, and 11, a high retardation may be required to produce an emitted light that will be perceived the same by a user wearing sunglasses regardless of the orientation of the display. The light received by optical film 82 may have particular wavelength in the display output spectrum that has a narrow and strong peak (e.g., 600-650 nm or approximately 620 nm) that looks different to the user depending on the orientation of the display. One way to correct this issue is to increase the retardation of the optical film while maintain a uniform thickness in the entire film. Retardation of a layer is calculated with the equation $Re = \Delta n \times d$, where Re is the retardation of the layer, d is the thickness of the layer, and $\Delta n$ (which may optionally be written as $(n_e - n_o)$) is the birefringence of the layer. Accordingly, increasing the retardation of optical film 82 to ensure uniform light regardless of display orientation may require increasing the thickness of the optical film (since retardation is directly proportional to thickness). For example, if the film has a uniform thickness a retardation of 30,000 may be required to ensure uniform output of light. Achieving this level of retardation may necessitate a thick film that takes up an undesirably large amount of z-height in the electronic device.

Instead of increasing the thickness of the optical film to increase the retardation of the film and ensure uniform output at all wavelengths (including the particular wavelength (e.g., 620 nm as mentioned above)), the optical film may have a non-uniform thickness. For example, the optical film may have some regions with a first thickness and other regions with a second thickness that is different than the first thickness. The regions of the optical film may be referred to as first thickness regions and second thickness regions or normal thickness regions and reduced thickness regions. The thickness of the reduced thickness regions may be reduced so that the reduced thickness regions have a reduced retardation. The retardation of the reduced thickness regions may have a retardation of $Re_{reduced} = Re_{normal} - (\lambda/2 + m^*\lambda)$, where $Re_{reduced}$ is the retardation of the reduced thickness regions, $Re_{normal}$ is the retardation of the normal thickness regions, $\lambda$ is the particular wavelength (e.g., 620 nm), and m is an offset factor (e.g., 0, ±1, ±2, ±3, etc.). The reduced retardation of the reduced thickness regions may result in light emitted from the optical film that is perceived the same by the user regardless of the orientation of the display.

Figure 12:
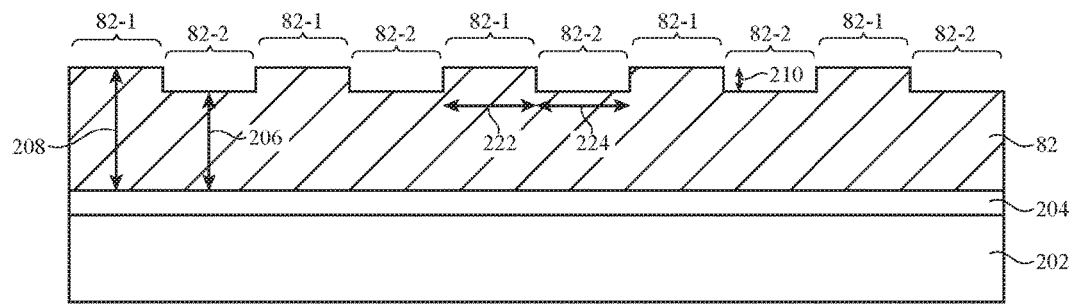
FIGS. 12 and 13 are cross-sectional side views of an illustrative sunglass-friendly optical film with reduced thickness areas in accordance with an embodiment.
Figure 13:
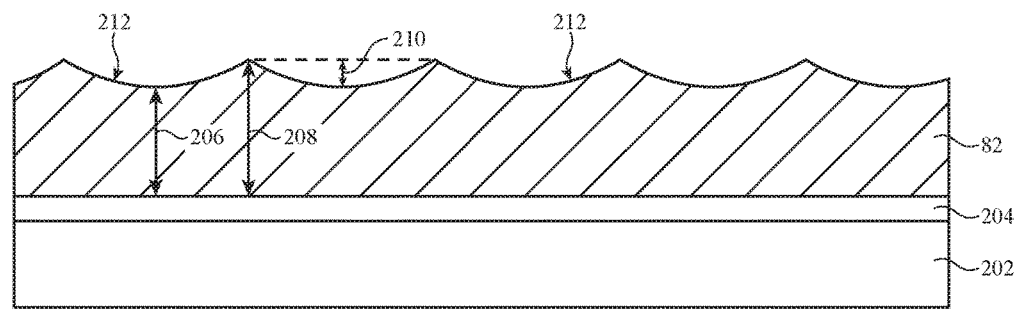

FIGS. 12 and 13 are cross-sectional side views of an optical film with reduced thickness regions. As shown, sunglass-friendly optical film 82 may be attached to a polarizer 202 by adhesive 204. Polarizer 202 may be a polarizer such as polarizer 54 in FIG. 6 or polarizer 184 in FIGS. 10 and 11. Sunglass-friendly film 82 may be attached to polarizer 202 using adhesive 204, as shown in FIGS. 12 and 13. However, these examples are merely illustrative. If desired, sunglass-friendly film 82 may be laminated directly to polarizer 202 or attached to polarizer 202 using other methods. Adhesive 204 may be an optically clear adhesive or any other desired type of adhesive.

As shown in FIG. 12, optical film 82 may be patterned into normal thickness regions 82-1 and reduced thickness regions 82-2. The normal thickness regions 82-1 may have a thickness 208 while the reduced thickness regions 82-2 may have a thickness 206. Thicknesses 208 and 206 may be any desired thicknesses (e.g., less than 5 microns, less than 10 microns, greater than 5 microns, greater than 20 microns, greater than 40 microns, between 30 and 50 microns, greater than 100 microns, less than 100 microns, greater than 1000 microns, etc.). The difference in thicknesses 206 and 208 is step size 210. Step size 210 may be any desired length (e.g., less than 1 microns, between 1 and 2 microns, between 0.5 and 5 microns, less than 5 microns, less than 10 microns, greater than 5 microns, greater than 50 microns, etc.).

To achieve the desired output from display 14, the reduced thickness portions of optical film 82 may be combined with the normal thickness portions of optical film 82 at a desired ratio. As shown in FIG. 12, the normal thickness portions may have a width 222 and the reduced thickness portions may have a width 224. Widths 222 and 224 may be any desired widths (e.g., less than 50 microns, less than 100 microns, between 50 and 100 microns, between 75 and 80 microns, approximately 78 microns, less than 1000 microns, greater than 75 microns, etc.). In some embodiments, the widths 222 and 224 may be the same. This means that the ratio of normal thickness area to reduced thickness area is 1:1. The ratio of normal thickness area to reduced thickness area may be any ratio: (e.g., 1:1, 1:2, 1:3, 2:1, 3:1, between 1:2 and 2:1, between 1:3 and 3:1, greater than 3:1, less than 1:3, etc.). Said another way, the reduced thickness area may make up 50% of the entire optical film or another desired percentage of the entire optical film (e.g., 50%, 40%, 45%, 60%, between 45% and 55%, between 40% and 60%, between 30% and 70%, etc.).

FIG. 12 shows recessed portions 82-2 with planar surfaces. However, the recesses that form reduced thickness portions 82-2 may instead by formed by curved surfaces. FIG. 13 shows an illustrative example of reduced thickness portions 82-2 of optical film 82 formed by concave surfaces 212 in optical film 82. The peak thickness of the normal thickness regions may still be thickness 208, and the lowest thickness of the reduced thickness regions may still be thickness 206. However, instead of an instant change between thickness 206 and thickness 208 as shown in FIG. 12, the film in FIG. 13 may have a smooth and gradual change between thickness 206 and thickness 208.

The embodiments of FIGS. 12 and 13 where optical film 82 is positioned on polarizer 202 are merely illustrative. As discussed in connection with FIGS. 6-11, optical film 82 may be positioned in any desired location in the display.

Figure 14A:
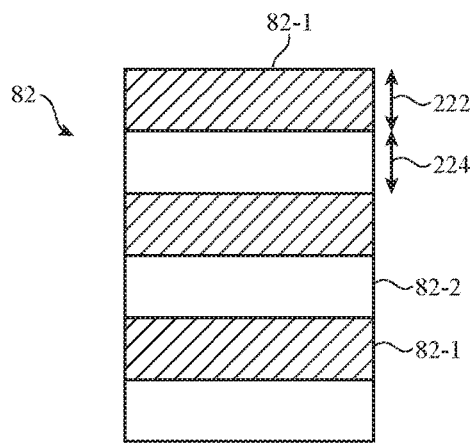
FIGS. 14A-14E are top views of illustrative sunglass-friendly optical films with reduced thickness areas in accordance with an embodiment.
Figure 14D:
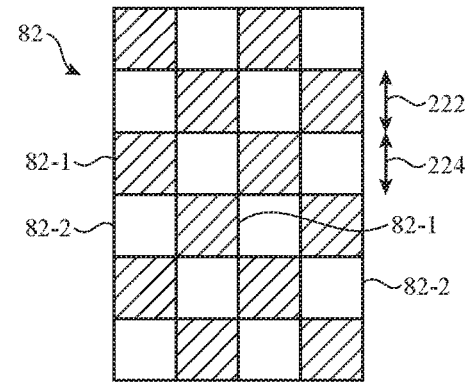
Figure 14B:
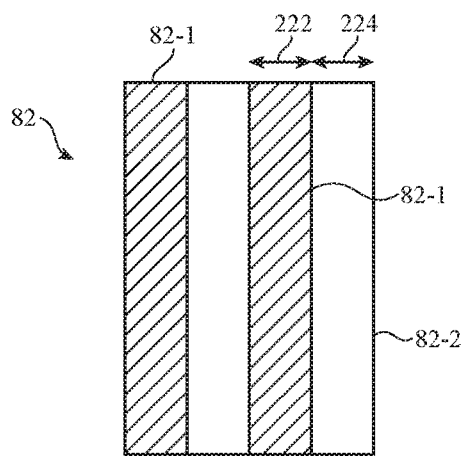
Figure 14E:
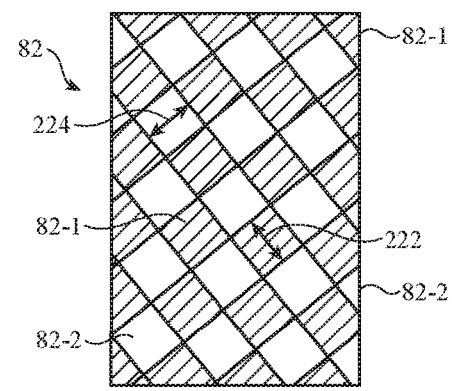
Figure 14C:
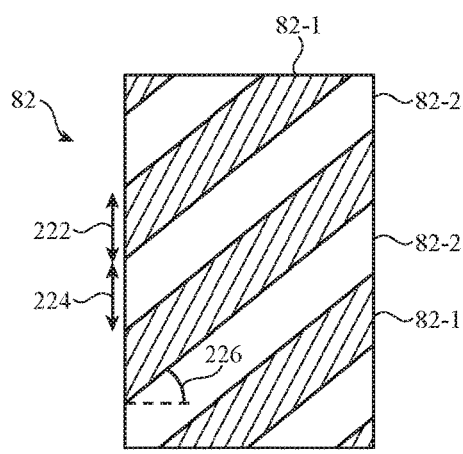

There are a number of possible arrangements for the reduced thickness portions of optical film 82. FIGS. 14A-14E are top views of optical film 82 showing different arrangements for normal thickness portions 82-1 and reduced thickness portions 82-2. As shown in FIG. 14A, the reduced thickness portions and normal thickness portions may be arranged in alternating horizontal stripes. Alternatively, as shown in FIG. 14B, the reduced thickness portions and normal thickness portions may be arranged in alternating vertical stripes. FIG. 14C shows yet another arrangement where the reduced thickness portions and normal thickness portions are arranged in alternating slanted stripes. The slanted stripes may be positioned at an angle 226 relative to the bottom surface of the film. Angle 226 may be any angle between 0° (i.e., horizontal stripes) and 90° (i.e., vertical stripes). The slanted stripes may also run from the upper left of the optical film to the lower right of the optical film (i.e., angle 226 may also be between 180° and 90°).

Instead of the reduced thickness portions and normal thickness portions of optical film 82 being arranged in stripes (as shown in FIGS. 14A-14C), the reduced thickness portions and normal thickness portions of optical film 82 may be arranged in a checkerboard pattern. An arrangement of this type is shown in FIG. 14D, with a checkerboard pattern of the normal thickness portions and reduced thickness portions. The checkerboard pattern may be formed by squares or rectangles of any desired size. Similar to the slanted stripes discussed in connection with FIG. 14C, the checkerboard pattern of FIG. 14D may be positioned at any desired angle relative to the bottom of the film. An illustrative example of the checkerboard pattern being angled is shown in FIG. 14E.

Optical film 82 may be formed from any desired material. For example, optical film 82 may be formed from cyclic olefin polymers (COP), anti-static polyethylene terephthalate (AS-PET), polyethylene naphthalate (PEN), or any other desired polymer or crystal material. In general, optical film 82 may be formed from any material that is birefringent. In some embodiments, optical film 82 may be formed from liquid crystal material.

Figure 15:
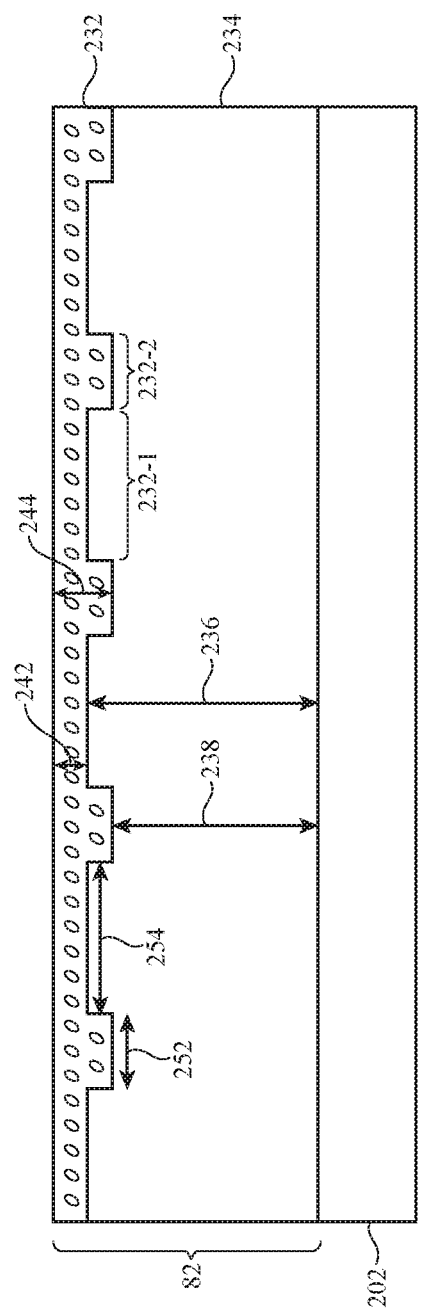
FIGS. 15 and 16 are cross-sectional side views of illustrative sunglass-friendly films with liquid crystal layers in accordance with an embodiment.

FIG. 15 shows an illustrative embodiment where sunglass-friendly optical film 82 is formed from a liquid crystal layer 232 on a base film 234. The base film may have a retardation of 0 (i.e., base film 234 may be formed from a material that is not birefringent such as polyimide). Base film 234 may sometimes be referred to as an alignment film. Base film 234 may be patterned to form regions that have a thickness 236 and regions that have a thickness 238. Thicknesses 236 and 238 may be any desired thicknesses (e.g., less than 40 microns, less than 20 microns, less than 10 microns, greater than 5 microns, greater than 30 microns, between 30 and 50 microns, between 25 and 35 microns, greater than 50 microns, greater than 100 microns, greater than 1000 microns, etc.). Liquid crystal layer 232 may have regions with a thickness 242 and regions with a thickness 244. The regions of liquid crystal layer 232 with thickness 242 (i.e., regions 232-1) may be quarter wave plates (QWPs). Regions 232-1 of liquid crystal layer 232 may have any desired thickness 242 (e.g., between 1.5 and 2 microns, between 1 and 2.5 microns, between 1 and 2 microns, less than 1 microns, greater than 0.5 microns, greater than 5 microns, etc.). The regions of liquid crystal layer 232 with thickness 244 (i.e., regions 232-2) may be three quarter wave plates (3QWPs). Regions 232-2 of liquid crystal layer 232 may have any desired thickness 244 (e.g., between 4 and 6 microns, between 1 and 8 microns, greater than 1 microns, less than 2 microns, greater than 10 microns, etc.).

As shown in FIG. 15, the three quarter wave plate portions of liquid crystal layer 232 may have a width 252 and the quarter wave plate portions may have a width 254. Widths 252 and 254 may be any desired widths (e.g., less than 50 microns, greater than 25 microns, between 25 and 50 microns, less than 100 microns, between 50 and 100 microns, between 75 and 80 microns, approximately 78 microns, less than 1000 microns, greater than 75 microns, etc.). The three quarter wave plate portions may make up 30% of the entire liquid crystal layer or any other desired percentage (e.g., between 25% and 35%, between 20% and 40%, between 10% and 50%, greater than 10%, less than 60%, etc.).

Figure 16:
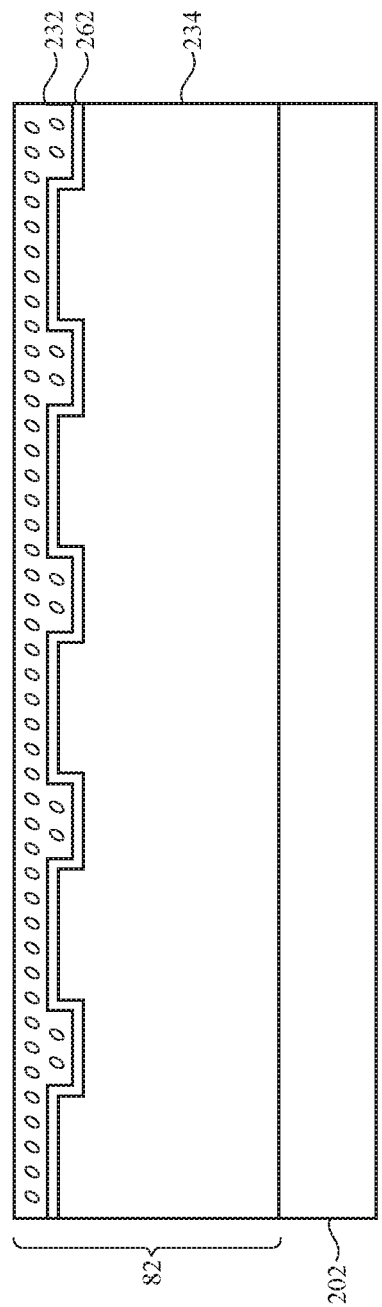

An additional layer may sometimes be formed between base film 234 and liquid crystal layer 232. An embodiment of this type is shown in FIG. 16. As shown, polyimide layer 262 is formed between base film 234 and liquid crystal layer 232. Polyimide layer 262 may sometimes be referred to as an alignment film.

The three quarter wave plate regions and quarter wave plate regions may be arranged in vertical, horizontal or slanted stripes, a checkerboard pattern, an offset checkerboard pattern, or any other desired pattern (similar to as shown in FIGS. 14A-E).

In the embodiments of FIGS. 12, 13, 15, and 16, the thickness of a birefringent material is selectively reduced to improve the output of the display for users wearing sunglasses. The thickness of the birefringent material is adjusted in order to adjust the retardation of the optical film in those regions. However, instead of selectively adjusting the thickness of the film to alter retardation, the birefringence of the film may be selectively adjusted to alter retardation. An embodiment of this type is shown in FIG. 17.

Figure 17:
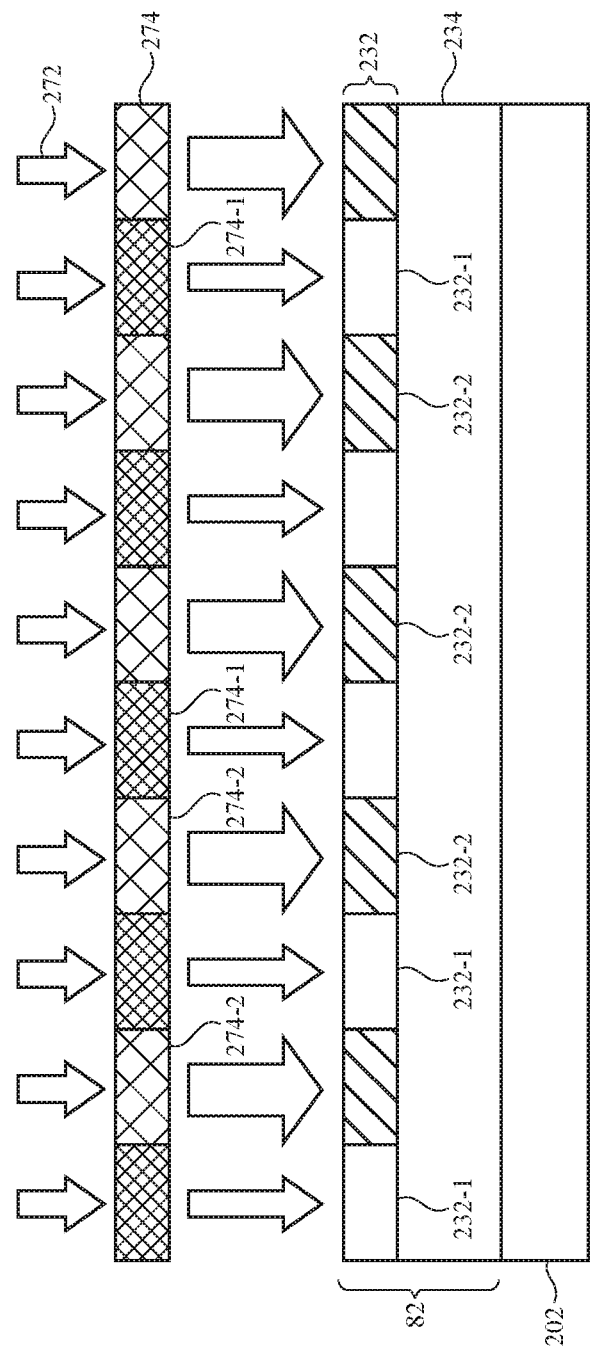
FIG. 17 is a cross-sectional side view of an illustrative sunglass-friendly film with varied birefringence in accordance with an embodiment.

As shown in FIG. 17, optical film 82 may include a liquid crystal layer 232 with uniform thickness across the liquid crystal layer. Instead of a varied thickness, liquid crystal layer 232 may have regions with different birefringence. Regions 232-1 may have a lower birefringence and form quarter wave plates, while regions 232-2 may have a higher birefringence and form three quarter wave plates. The birefringence of liquid crystal layer 232 may be selectively altered by different exposure to ultraviolet (UV) light. Ultraviolet light 272 may be emitted through half-tone mask 274. Half-tone mask 274 may allow certain amounts of light through different portions of the mask. In FIG. 17, mask 274 includes regions 274-1 that allow less light to pass than regions 274-2. The liquid crystal regions that are exposed to more light (i.e., regions 232-2) have a higher resulting birefringence than the liquid crystal regions that are exposed to less light (i.e., regions 232-1). This example is merely illustrative. In other embodiments (depending on the liquid crystal material used), the liquid crystal material that is exposed to more UV light may have a lower birefringence than the liquid crystal material that is exposed to less UV light.

Figure 18:
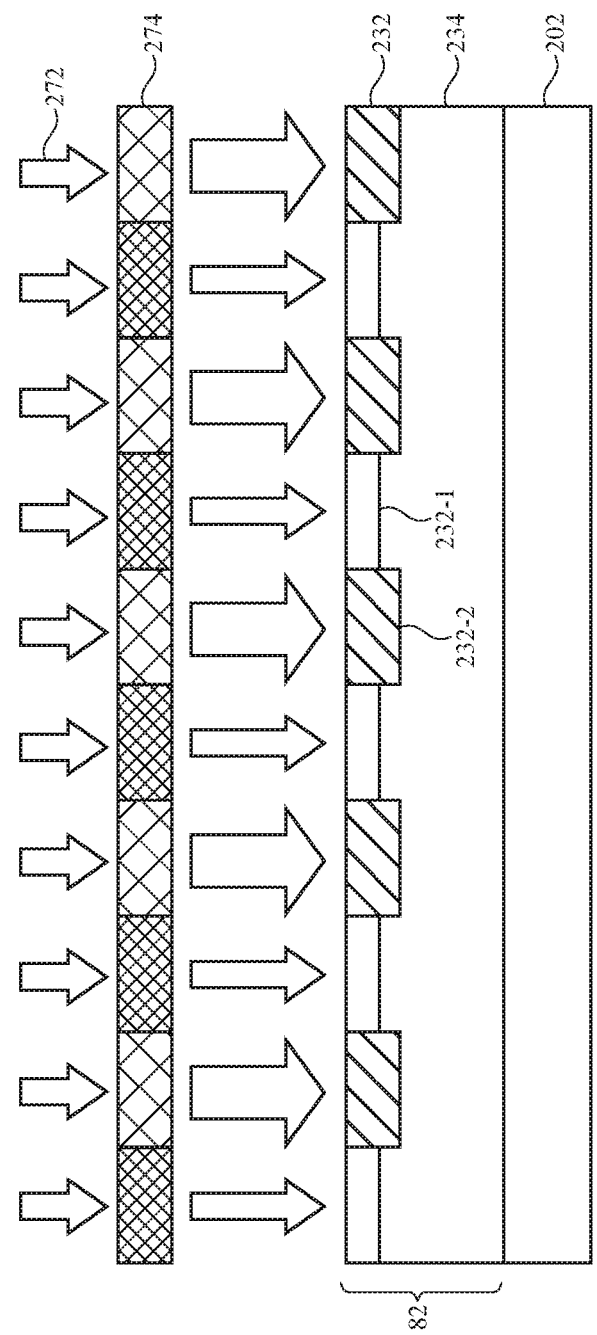
FIG. 18 is a cross-sectional side view of an illustrative sunglass-friendly film with varied birefringence and thickness in accordance with an embodiment.

If desired, both the thickness and the birefringence of the birefringence material may be selectively altered. An embodiment of this type is shown in FIG. 18. As shown, regions 232-2 of liquid crystal layer 232 may have a larger thickness and greater birefringence than regions 232-1 of liquid crystal layer 232. In general, the retardation of the optical film may be selectively altered using any combination of thickness and birefringence variation.

In various embodiments, a display may include display layers, a linear polarizer that receives light from the display layers, and an optical film positioned above the linear polarizer. The optical film may be formed from a birefringent material and the optical film may be patterned into first regions with a first thickness and second regions with a second thickness that is different than the first thickness. The display layers may include a liquid crystal layer that is interposed between a color filter layer and a thin-film transistor layer. The linear polarizer may be an upper polarizer formed above the liquid crystal layer, and the display may also include a lower polarizer formed below the liquid crystal layer. The display layers may include an organic emissive layer that is interposed between an anode and a cathode. The linear polarizer may be formed above a quarter wave plate.

The optical film may be attached to the linear polarizer with a layer of adhesive. The optical film may be laminated directly to the linear polarizer. The optical film may be attached to an additional layer in the display. The additional layer may be a touch sensor layer. The first thickness and the second thickness may both be thicknesses between 30 and 50 microns. A difference between the first thickness and the second thickness may be between 0.5 and 5 microns. The first and second regions may be arranged in alternating horizontal, vertical, or slanted stripes. The first and second regions may be arranged in a checkerboard pattern. The linear polarizer may have a first optical axis, the optical film may have a second optical axis, and the second optical axis may be at a 45° angle relative to the first optical axis. The first regions may make up between 30% and 70% of the optical film.

In various embodiments, a display may include display layers, a linear polarizer that receives light from the display layers, and an optical film positioned above the linear polarizer. The optical film may include a base film and a layer of birefringent material and the layer of birefringent material may have three quarter wave plate regions and quarter wave plate regions. The layer of birefringent material may be a liquid crystal layer, the three quarter wave plate regions may have a first thickness, the quarter wave plate regions may have a second thickness, and the first thickness may be greater than the second thickness. The three quarter wave plate regions may have a first birefringence, the quarter wave plate regions may have a second birefringence, the first thickness may be the same as the second thickness, and the first birefringence may be greater than the second birefringence. The three quarter wave plate regions may make up between 10% and 50% of the layer of birefringent material.

In various embodiments, a display may include a color filter layer, a thin-film transistor layer, a first liquid crystal layer that is interposed between the color filter layer and the thin-film transistor layer and that has first and second opposing sides, a lower polarizer layer on the first side of the first liquid crystal layer, an upper polarizer layer on the second side of the first liquid crystal layer that has a first optical axis, and an optical film above the upper polarizer layer. The optical film may include a base film and a second liquid crystal layer, the second liquid crystal layer may have first regions with a first thickness and second regions with a second thickness that is different than the first thickness, and the second liquid crystal layer may have a second optical axis that is at a 45° angle relative to the first optical axis.

The foregoing is merely illustrative and various modifications can be made by those skilled in the art without departing from the scope and spirit of the described embodiments. The foregoing embodiments may be implemented individually or in any combination.

What is claimed is:

1. A display comprising:
   display layers;
   a linear polarizer that receives light from the display layers and that has a first optical axis; and
   an optical film positioned above the linear polarizer, wherein the entire optical film is formed from a single birefringent material, wherein the optical film is patterned into first regions with a first thickness and second regions with a second thickness that is different than the first thickness, and wherein the entire optical film has a second optical axis that is at a given angle relative to the first optical axis.

2. The display defined in claim 1, wherein the display layers comprise a liquid crystal layer that is interposed between a color filter layer and a thin-film transistor layer, wherein the linear polarizer is an upper polarizer formed above the liquid crystal layer, and wherein the display further comprises a lower polarizer formed below the liquid crystal layer.

3. The display defined in claim 1, wherein the display layers comprise an organic emissive layer that is interposed between an anode and a cathode.

4. The display defined in claim 3, wherein the linear polarizer is formed above a quarter wave plate.

5. The display defined in claim 1, wherein the optical film is attached to the linear polarizer with a layer of adhesive.

6. The display defined in claim 1, wherein the optical film is laminated directly to the linear polarizer.

7. The display defined in claim 1, wherein the optical film is attached to a touch sensor layer.

8. The display defined in claim 1, wherein the first thickness and the second thickness are both thicknesses between 30 and 50 microns and wherein a difference between the first thickness and the second thickness is between 0.5 and 5 microns.

9. The display defined in claim 1, wherein the first and second regions are arranged in alternating horizontal, vertical, or slanted stripes.

10. The display defined in claim 1, wherein the first and second regions are arranged in a checkerboard pattern.

11. The display defined in claim 1, wherein the given angle is a 45° angle.

12. The display defined in claim 1, wherein the first regions make up between 30% and 70% of the optical film.

13. A display comprising:
   display layers;
   a linear polarizer that receives light from the display layers; and
   an optical film positioned above the linear polarizer, wherein the optical film comprises a base film and a layer of birefringent material, wherein the layer of birefringent material has three quarter wave plate regions and quarter wave plate regions, and wherein the three quarter wave plate regions make up between 25% and 35% of the layer of birefringent material.

14. The display defined in claim 13, wherein the layer of birefringent material is a liquid crystal layer, wherein the three quarter wave plate regions have a first thickness, wherein the quarter wave plate regions have a second thickness, and wherein the first thickness is greater than the second thickness.

15. The display defined in claim 13, wherein the layer of birefringent material is a liquid crystal layer, wherein the three quarter wave plate regions have a first thickness and a first birefringence, wherein the quarter wave plate regions have a second thickness and a second birefringence, wherein the first thickness is the same as the second thickness, and wherein the first birefringence is greater than the second birefringence.

16. The display defined in claim 1, wherein the entire optical film has a given birefringence.

17. A display comprising:
   display layers;
   a linear polarizer that receives light from the display layers; and
   an optical film positioned above the linear polarizer, wherein the optical film is formed from a birefringent material and wherein the optical film is patterned to have a plurality of recesses defined by curved surfaces, wherein the linear polarizer has a first optical axis and the entire optical film has a second optical axis that is at a given angle relative to the first optical axis.

18. The display defined in claim 17, wherein the curved surfaces comprise concave surfaces.

19. The display defined in claim 17, wherein the curved surface curve towards a planar lower surface of the optical film.

* * * * *